United States Patent
Blednov (10) Patent No.: US 9,450,283 B2
(45) Date of Patent: Sep. 20, 2016

(54) POWER DEVICE AND A METHOD FOR CONTROLLING A POWER DEVICE

(75) Inventor: Igor Blednov, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 2036 days.

(21) Appl. No.: 11/722,521

(22) PCT Filed: Dec. 15, 2005

(86) PCT No.: PCT/IB2005/054271

§ 371 (c)(1),
(2), (4) Date: Mar. 25, 2010

(87) PCT Pub. No.: WO2006/067705

PCT Pub. Date: Jun. 29, 2006

(65) Prior Publication Data

US 2010/0188164 A1  Jul. 29, 2010

(30) Foreign Application Priority Data

Dec. 21, 2004 (EP) .................................. 04106793

(51) Int. Cl.
*H01B 1/04* (2006.01)
*H01P 5/18* (2006.01)
(Continued)

(52) U.S. Cl.
CPC ............... *H01P 5/18* (2013.01); *H01L 23/66* (2013.01); *H01L 24/49* (2013.01); *H03H 7/383* (2013.01); *H03H 7/48* (2013.01); *H04W 52/52* (2013.01);
(Continued)

(58) Field of Classification Search
CPC ............ H01L 23/66; H01L 24/45; H01L 2924/01068; H01L 24/48; H01L 2924/20753; H01L 2924/19043; H01L 2924/19042; H01L 2924/19041; H01L 2223/6644; H01L 2924/01005; H01L 2924/01079; H01L 2924/01082; H01L 2224/45144; H01L 2924/00014; H01L 2224/48091; H01L 2224/49111; H01L 2224/48472; H01L 2924/00; H01L 2224/49175; H01L 2224/48; H01P 5/16; H01P 5/18; H03G 3/30; H03G 3/3042; H04B 7/005; H04B 1/0458; H04B 1/04; H04W 52/04
USPC ............................................ 330/302; 333/109
See application file for complete search history.

(56) References Cited

U.S. PATENT DOCUMENTS 3,497,825 A * 2/1970 Best ............................ 330/54
4,122,400 A   10/1978 Medendorp et al.
(Continued)

FOREIGN PATENT DOCUMENTS

DE   3924426 A1   3/1990
EP   0 609 097 A2   8/1994
(Continued)

OTHER PUBLICATIONS

International Search Report in related PCT/IB2005/054271 dated Mar. 30, 2006.

*Primary Examiner* — Son Le
(74) *Attorney, Agent, or Firm* — McDonnell Boehnen Hulbert & Berghoff LLP (57) ABSTRACT

An RF power device that includes a transistor with a compact impedance transformation circuit, where the transformation circuit includes a lumped element CLC analog transmission line and an associated embedded directional bilateral RF power sensor that is inductively coupled to the transmission line to provide detection of direct and reflected power independently with high directivity.

9 Claims, 6 Drawing Sheets

(51) Int. Cl.
*H01L 23/66* (2006.01)
*H03H 7/38* (2006.01)
*H03H 7/48* (2006.01)
*H04W 52/52* (2009.01)
*H01L 23/00* (2006.01)

(52) U.S. Cl.
CPC ............... *H01L 24/45* (2013.01); *H01L 24/48* (2013.01); *H01L 2223/6611* (2013.01); *H01L 2223/6644* (2013.01); *H01L 2224/45015* (2013.01); *H01L 2224/45144* (2013.01); *H01L 2224/4813* (2013.01); *H01L 2224/48091* (2013.01); *H01L 2224/48472* (2013.01); *H01L 2224/49111* (2013.01); *H01L 2224/49175* (2013.01); *H01L 2224/49176* (2013.01); *H01L 2924/01005* (2013.01); *H01L 2924/01006* (2013.01); *H01L 2924/01015* (2013.01); *H01L 2924/01033* (2013.01); *H01L 2924/01068* (2013.01); *H01L 2924/01079* (2013.01); *H01L 2924/01082* (2013.01); *H01L 2924/13091* (2013.01); *H01L 2924/19041* (2013.01); *H01L 2924/19042* (2013.01); *H01L 2924/19043* (2013.01); *H01L 2924/20753* (2013.01); *H01L 2924/3011* (2013.01); *H01L 2924/30105* (2013.01); *H01L 2924/30107* (2013.01); *H01L 2924/30111* (2013.01)

(56) References Cited

U.S. PATENT DOCUMENTS

| | | | |
|---|---|---|---|
| 4,547,746 A | | 10/1985 | Erickson et al. |
| 5,304,961 A | * | 4/1994 | Dydyk .................. 333/112 |
| 5,530,922 A | * | 6/1996 | Nagode ................. 455/126 |
| 5,625,328 A | * | 4/1997 | Coleman, Jr. .......... 333/116 |
| 5,886,591 A | | 3/1999 | Jean et al. |
| 5,994,965 A | | 11/1999 | Davis et al. |
| 2002/0097094 A1 | | 7/2002 | Wang et al. |
| 2002/0196085 A1 | * | 12/2002 | Nakamata et al. ........... 330/302 |
| 2003/0155971 A1 | | 8/2003 | Kolodziej et al. |
| 2004/0100325 A1 | | 5/2004 | Van Ameron |
| 2005/0026573 A1 | * | 2/2005 | Cho ................... 455/114.2 |
| 2005/0190011 A1 | | 9/2005 | Martin, III et al. |

FOREIGN PATENT DOCUMENTS

| | | |
|---|---|---|
| EP | 0790503 A1 | 8/1997 |
| JP | 10-256850 A | 9/1998 |
| JP | 2005-527167 A | 9/2005 |
| WO | 03/081670 A1 | 10/2003 |

* cited by examiner

POWER DEVICE AND A METHOD FOR CONTROLLING A POWER DEVICE

The present invention relates to a power device and a method for monitoring a power device.

RF power devices in amplifiers receive an input signal and provide an output signal that is typically a larger magnitude version of the input signal.

However, many forms of power devices require some form of power control to maintain or improve the characteristics of the power device, for example the efficiency of the power device or the linearity characteristics. In particular, in most linearization systems a RF power device typically requires some form of output power monitoring and control to ensure that the modulation component of an input signal in the amplified output signal is acceptably linear.

One well known technique for providing power monitoring in RF power devices is the use of RF power couplers that can also be used to provide power division or distribution in microwave circuits to allow biasing and control of an RF power device, which can be used in a variety of applications, for example RF power control systems, RF power monitoring, linearization of RF amplifiers such as envelope elimination and restoration and feedforward amplifiers.

Further, RF power couplers can also be used to provide protection of RF power devices from failure during output mismatch where the output mismatch is identified by the monitoring of power reflected from an output load.

Typically RF power couplers are provided by the use of distributed transmission lines and lumped element LC networks. However, as most RF power couplers are based on the properties of quarter wave length transmission lines that are formed on the surface of a substrate with limited dielectric constant this can result in transmission lines being relatively long, for example for an operating frequency of 2 GHz a quarter wave length transmission line made even on a substrate with a high relative permittivity, for example an Er equal to 10, will be of the order of 20 mm.

As such, the use of a distributed coupler requires significant space on a printed circuit board and consequently can result in the introduction of additional time delays of the subtracted replica of the output signal when being used for power control and linearization.

It is desirable to improve this situation.

It is an object of the present invention to provide a power sensor for monitoring the direct and reflected power of a power device in a compact design and with high directivity.

In accordance with an aspect of the present invention there is provided a power device and a method for monitoring a power device as described in the accompanying claims.

This provides the advantage of allowing independent control of power delivered to a load and power reflected from it, with high directivity or isolation between forward and reflected power sensors ports.

Additionally, this provides the advantage of allowing a bilateral power sensor circuit to be incorporated within a discrete device in a RF power module packaging in a compact design. Particularly, the ground plane of the transmission line may be provided as part of a package, as part of a heatsink on which the discrete device is assembled or of course separately. The inductive coupling can then be realized with bond wires.

Furthermore, it has been found that this implementation of the power sensor within the package of a discrete power transistor shows a good coupling behaviour. Both direct power and reflected power associated with the power device may be determined with a wide range of isolation, thereby allowing greater and more accurate control over the power device.

The signal sensed by the power sensor is suitably applied to the input of a bias control circuit. Herewith the maximum level of the amplifier can be set.

The transmission line that is arranged to form an output impedance matching circuit for the transistor, is particularly a lumped element analogue of a quarter wavelength transmission line of specific characteristic impedance Z. This provides the advantage of allowing a more compact design compared to that of distributed transmission lines. Most suitably an inductive element of the impedance transformation CLC circuit is arranged to be a plurality of parallel bonding wires. This provides the advantage of providing a high quality, flexible and almost ideal inductive element at the output of the power device. The use of parallel bonding wires together with the capacitive components can provide a wide range of characteristic impedances for the transformation circuit. Additionally, this transformation circuit is suitable for use in the design of an integrated bilateral power sensor circuit.

Preferably a 'low pass' filter circuit is used as an input to the RF power device, i.e. the transistor. Prematching with the help of such low pass filter is desired to match the impedance of the transistor with earlier amplifier stages or even the transceiver IC. A suitable prematching circuit includes a L-C-L topology, wherein the capacitor is connected between the input signal and ground. The inductances are suitably embedded as a plurality of bond wires. Their length and their number are chosen so as to optimise the desired impedance and filter characteristics.

It is suitable that several transistors are placed in parallel to each other, while the power transistor is coupled to only one of them. In power amplifier applications, the power sensor is desired to provide a further tuning of the output level. There is no need to modify the power settings completely. As a result, to minimize losses, the power device is suitably subdivided into several parallel transistors, only one of which is provided with a power sensor to allow further tuning.

It is also suitable that the power sensor is itself coupled to a protection signal output. This is suitably an isolated port that provides a reflected power level. It is for instance coupled to ground over a suitably chosen resistance.

In a further embodiment, the input of the power transistor may be connected to the output of another power transistor. This leads to a two-stage amplifier. The coupling may herein extend, e.g. so that not only the power level of the main power transistor can be tuned, but also, if larger modifications are needed the power level of the first stage. A first implementation hereof may be, that the power control signal port will provide a signal to the first stage only if the feedback of the coupling surpasses a certain threshold voltage. A second implementation hereof is that there is a separate power sensor coupled to the output of the first stage and thus the input of the second stage (e.g. the main transistor).

These and other aspects of the invention will be apparent from and elucidated with reference to the embodiments described hereinafter.

Figure 1:
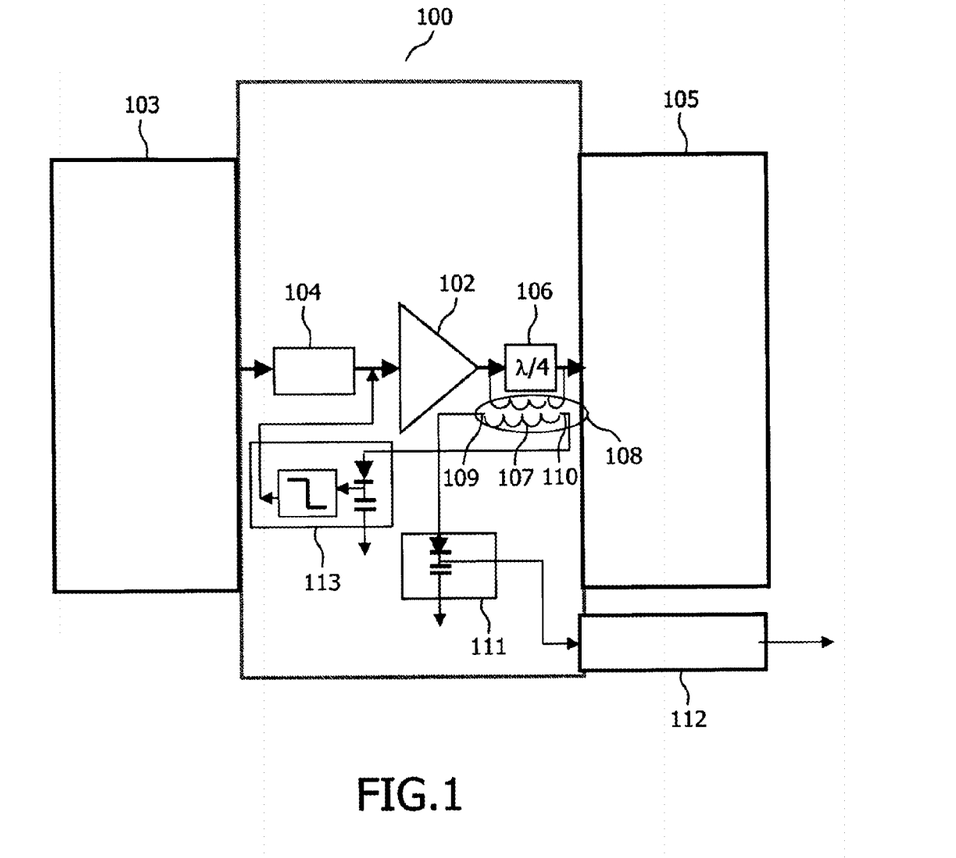
FIG. 1 illustrates a power device according to a first embodiment of the present invention.

An embodiment of the invention will now be described, by way of example, with reference to the drawings, of which:

FIG. 1 shows an equivalent power device 100, for example a power device suitable for amplifying RF signals, formed on a substrate 101 to form a discrete package.

The power device 100 includes an RF power transistor die 102, for example a MOSFET, LDMOST, BJT or HBT device, coupled to a power device input connector/lead 103 via a pre-matching circuit 104 to allow impedance matching of the RF power transistor 102 to an impedance of a signal source, as is well known to a person skilled in the art.

An output of the transistor die 102 is coupled to a power device output connector 105 via an output impedance matching circuit 106 that is arranged to allow impedance transformation of the output impedance of the transistor 102 to the impedance required by a load, as is well known to a person skilled in the art.

The output impedance matching circuit 106 is arranged to form an equivalent of a quarter wavelength transmission line, via the use of lumped element capacitance and bond wires as inductive elements, as described below.

A bilateral power monitoring circuit 107 (i.e. a power monitoring circuit that is arranged to monitor power in two directions, direct and reflected power) is inductively coupled to the output impedance matching circuit 106. The bilateral power monitoring circuit 107 is arranged to have a first port 109 and a second port 110. The bilateral power monitoring circuit 107 provides a portion of the forward output power going through the output impedance matching circuit 106 at the first port 106 and provides a portion of power reflected from a load (not shown) at the second port 110.

The first port 109 is coupled to an input of a first detection circuit 111 that generates an envelope feedback signal for allowing control/linearization or power monitoring of the power device 100. The signal from the first detection circuit 111 can be used by internal control circuitry (not shown) or an external control system (not shown) via an output lead 112. The second port 110 is coupled to a second detection circuit 113 that is for processing the portion of power reflected from a load to generate a signal for controlling the bias as the input of the power device 102. As such the second detection circuit 113 is used to prevent an overload condition at the output of the transistor 102.

Figure 2:
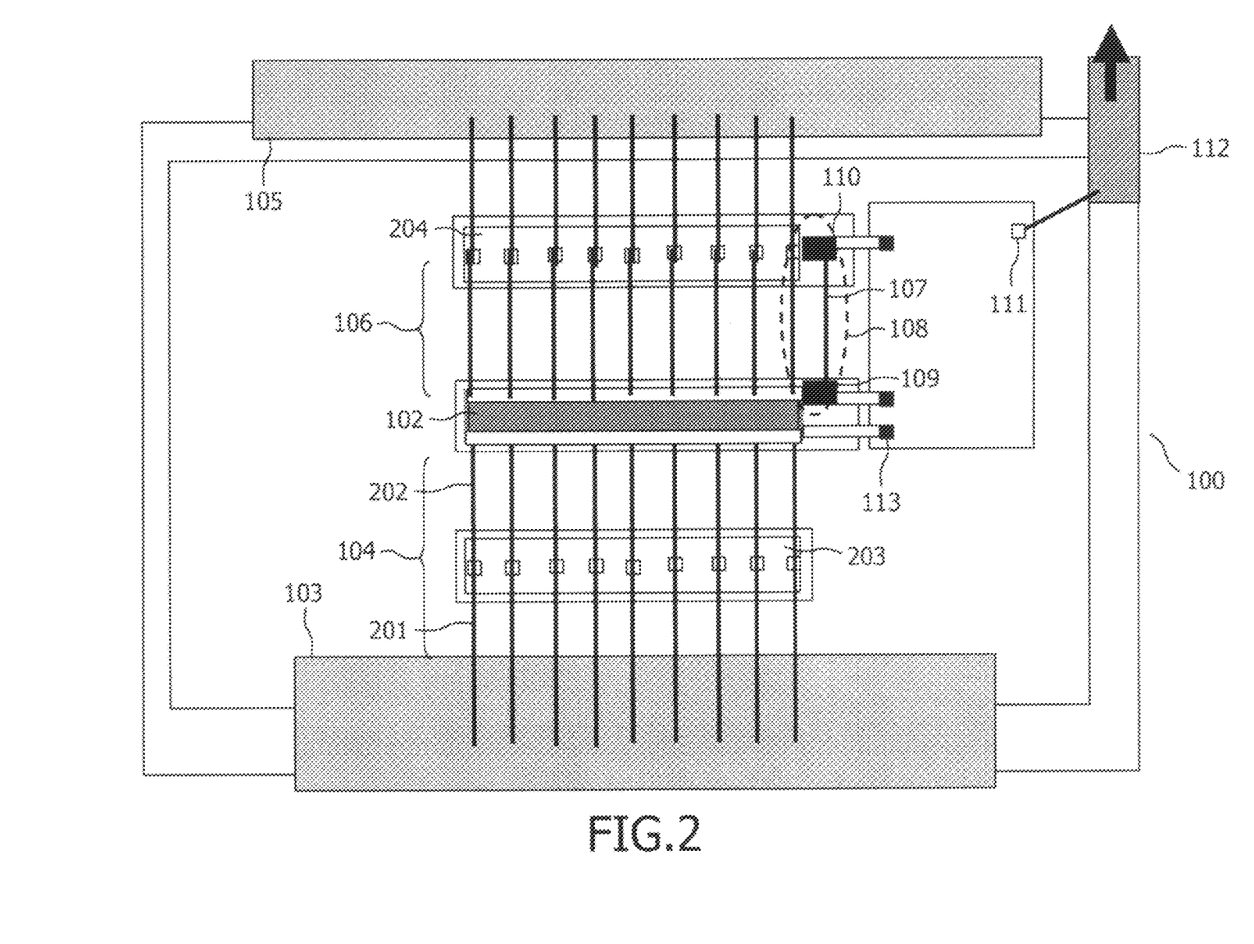
FIG. 2 illustrates a power device according to a second embodiment of the present invention.

As shown in FIG. 2, where the same reference numerals are used for the equivalent elements shown in FIG. 1, the pre-matching circuit 104 includes a plurality of connections formed between respective input ports on the transistor die 102 and the power device input connector 103. Each connection includes two inductive elements 201, 202, for example bonding wire, coupled via a capacitive element 203. The values of the two inductive elements 201, 202 and the capacitive element 203 for each connection are selected to allow appropriate input impedance matching, as is well known to a person skilled in the art.

Although a single connection can be used in the pre-matching circuit 104 between on input port of the transistor die 102 and the power device input connector 103 the current embodiment of the pre-matching circuit includes a plurality of wires or connections (i.e. nine connections) to overcome current limits that may be imposed by the input signal power, however, the pre-matching circuit 104 can include any number of wires/connections between the power device input connector 103 and the input port of the transistor die 102 dependent upon power requirements of the power device 100.

Also as shown in FIG. 2, the output matching circuit 106 includes a plurality of connections (i.e. nine connections) formed between respective output ports of the transistor die 102 and a capacitance 204, with the capacitance 204 being coupled to the power device output connector 105.

Figure 3:
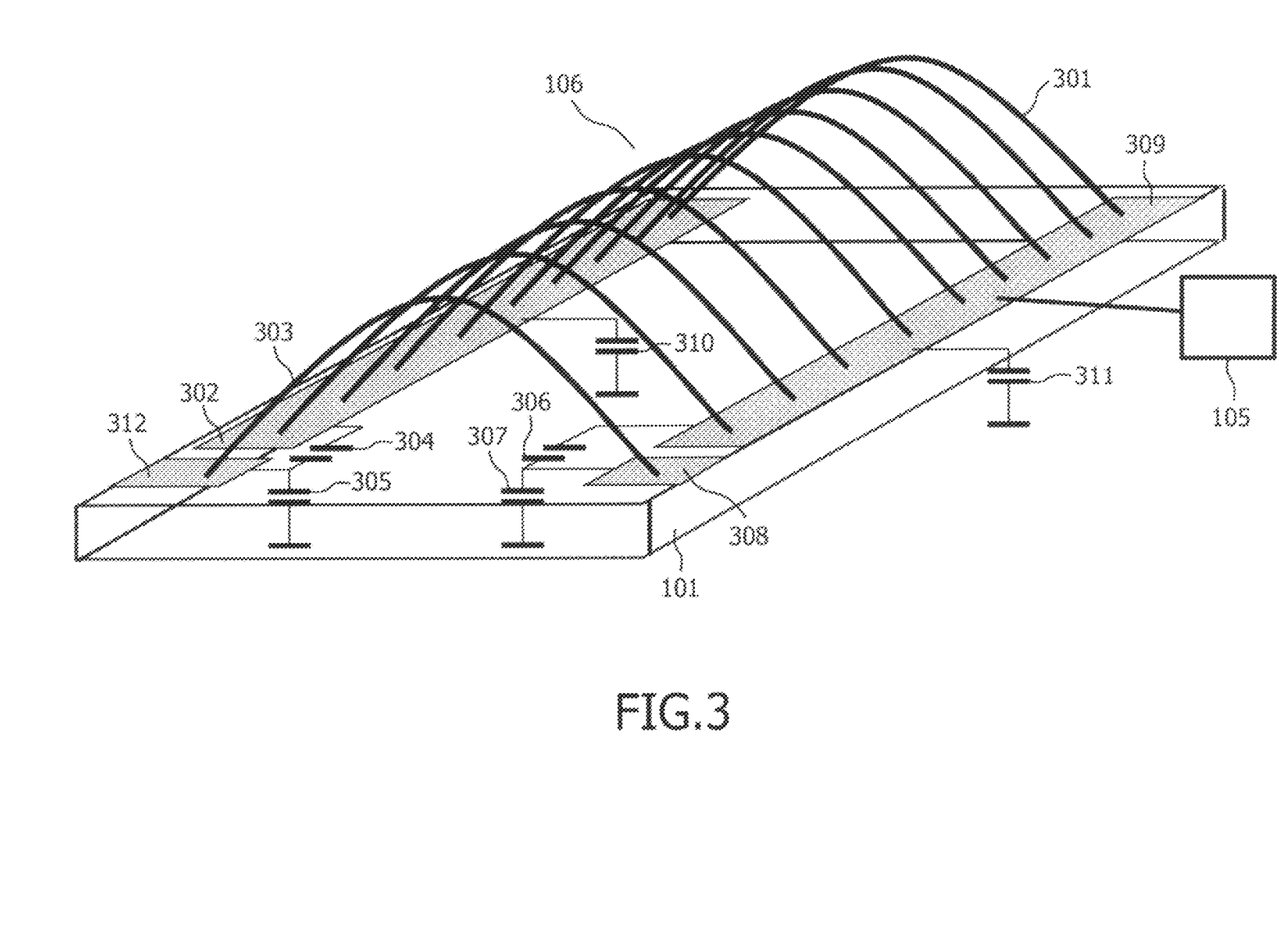
FIG. 3 illustrates an impedance transformation/matching circuit with a bilateral power sensor circuit according to an embodiment of the present invention.

As more clearly illustrated in FIG. 3 the output matching circuit 106 includes nine parallel bond wires 301, where each bond wire 301 is coupled at one end to an output metal bar 302 of the power transistor die 102, which acts as a parasitic capacitor, thereby forming a first capacitance 310 with reference to ground. The other end of the plurality of bond wires 301 are coupled to a metal bar 309 of the capacitor 204, thereby forming a second capacitance 311 with reference to ground. As stated above the capacitor 204 is connected to the power device output connector 105.

The parasitic capacitance 310 of the transistor die 102, which in this embodiment is 10 pF, acts as a first capacitance of a lumped element analog of a quarter wavelength transmission line, where the lumped element analog of a quarter wavelength transmission line acts as the output impedance matching circuit 106. The top of the parasitic capacitance 310 also acts as a first port of the output impedance matching circuit 106.

Additionally, mounting elements (not shown) associated with the transistor die 102 are arranged on the top of a package flange (not shown) where the top layer of the package flange is located under the bonding wires 301 and act as the ground plane for the transmission lines providing a return path for the output signals, however any suitable grounding point could be used.

The second capacitance 311 is arranged to form a capacitance having a capacitance of similar value to the first capacitance 310 of the transistor die 102 (i.e. 10 pF), where the metal bar 309 of the second capacitance 311 forms a second port for the output impedance matching circuit 106.

As such, the output impedance matching circuit 106 is arranged to form a lumped element equivalent of a quarter wave length (i.e. 90°) transmission line, which in this embodiment by way of illustration has a characteristic impedance $Z_o$ of 6 ohms. Although the current embodiment illustrates the output impedance matching circuit 106 as having an equivalent quarter wavelength transmission line, the output matching circuit 106 can be arranged to have a transmission line substantially equal to or multiples of odd numbers of 90 degrees.

For the current embodiment the mutual inductive coupling between the plurality of bond wires 301 that form the output impedance matching circuit 106 is provided by a spacing of 0.33 mm, however, any suitable spacing may be used.

Although the above embodiment shows the use of nine parallel bond wires 301 a single bond wire could used, however, the use of a single bond wire may limit the maximum transmitted RF power, for example the current may be limited to an average current of less than 0.6 A for a single 38 um diameter golden bond wire. As such any suitable number of bond wires could be used depending upon current requirements for the power device 100.

A bond wire 303 inductively coupled to the bond wires 301 of the output impedance matching circuit 106 (i.e.

output transformation circuit) is arranged to form together with four other capacitances 304, 305, 306, 307 as described below, the bilateral power monitoring circuitry 107 (i.e. the bilateral directional coupler).

As the magnetic field between the bond wires 303 of the bilateral power monitoring circuitry 107 and the bond wires 301 of the output impedance matching circuit 106 is inversely proportional to the distance between each bond wire 301 and bond wire 303 to the power of two the inductive coupling that occurs between the bond wires 303 of the bilateral power monitoring circuit 107 and the bonding wires of the output impedance matching circuit 106 mainly occurs between the closes located bond wires 301, 303.

The bilateral power monitoring circuitry 107 is formed from the bond wire 303, which is placed in parallel with the bonding wires 301 that are a part of the lumped element transmission line to allow inductive coupling, where one end of the bilateral power monitoring circuitry bond wire 303 is mounted on a first bonding pad 307 that is mounted adjacent to the metal bar 302 formed at the output of the transistor die 102. The other end of the bond wire 303 is mounted on a second bonding pad 308 that is mounted adjacent to the metal bar 309 of the capacitance 204. The second bonding pad 308 acts as a third port of the bilateral power monitoring circuitry 107 having, by way of illustration, a characteristic impedance $Z_o$ of 25 ohms, and the first bonding pad 312 acts as a fourth port of the bilateral power monitoring circuitry 107 having, by way of illustration, a characteristic impedance $Z_o$ of 25 ohms.

As such, the mutual inductance coupling between the plurality of bonding wires 301 that form the lumped element impedance transformation circuit 106 and the bond wire 303 of the bilateral power monitoring circuitry 107 in combination with associated capacitances 304, 305, 306, 307, as described below, result in the formation of a reflected power sensor port (i.e. the third port) and a forward power sensor port (i.e. the fourth port).

The use of the first bonding pad 312 placed adjacent to the metal bar 302 formed at the output of the transistor die 102 results in the formation of two of the four capacitors 304, 305, 306, 307, one capacitor 304 between the first bonding pad 307 and the transistor output metal bar 302 having, by way of illustration, a capacitance of 0.98 pF, and a second capacitor 305 between the first bonding pad 307 and earth (i.e. a reference voltage) having, by way of illustration, a capacitance of 2.15 pF. The use of the second bonding pad 308 placed adjacent to the metal bar 309 of the capacitance 204 results in the formation of two more of the four capacitors 304, 305, 306, 307, one capacitor 306 is created between the second bonding pad 308 and the metal bar 309 of the capacitance 204 having, by way of illustration, a capacitance of 0.98 pF, and another capacitor 307 between the second bonding pad 308 and earth having, by way of illustration, a capacitance of 2.15 pF.

This provides the advantage of having a means for monitoring the supplied power and reflected power from the power device 100 in a compact design and with high directivity between the direct path and reflected path.

Figure 4:
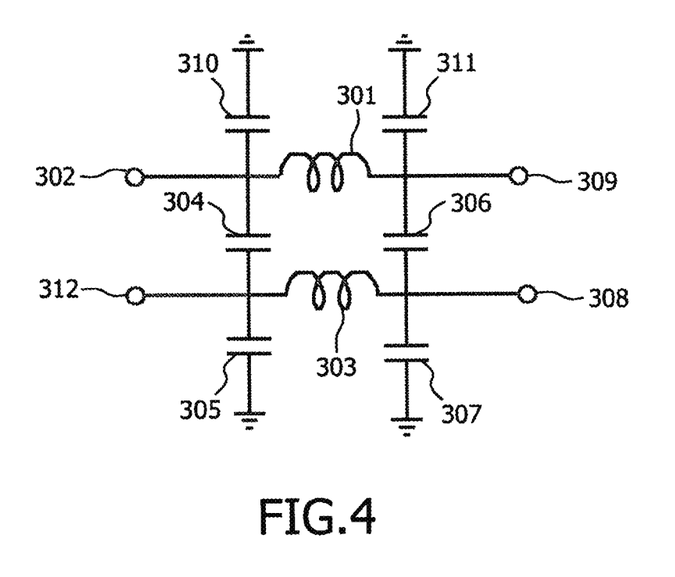
FIG. 4 illustrates an equivalent schematic of an impedance matching circuit according to an embodiment of the present invention.

An equivalent circuit for the output matching circuit 106 and the bilateral power monitoring circuitry 107 is shown in FIG. 4, which for the frequency band 1.6 to 2.6 GHz is arranged to provide isolation between reflected and direct power of <22 dB.

The power transmitted per single transmission line bond wire P_bw can be estimated as the output of the power device Pout divided by the number of bond wires, i.e. P_bw=Pout/n.

Accordingly, the power at the output port of the bilateral power monitoring circuitry 107 Pcoup (i.e. port 4) can be estimated as being:

$$Pcoup=Pout/n/0.5C$$

where C is a coefficient showing a ratio of power division between the second and fourth ports.

The third port of the bilateral power monitoring circuitry 107, also called the isolation port, represents the portion of power reflected from the load attached to the power device output.

As stated above, the third port is coupled to the output mismatch detection and protection circuitry 113, as shown in FIG. 1, to allow a measure of mismatch between direct and reflected power, thereby allowing the transistor bias to be adjusted to avoid damage to the transistor die 102 if a mismatch becomes too great. This has the advantage of allowing a power mismatch to be identified quickly and preventative action to be taken to avoid damage, for example allow adjustment of the transistor bias or modification of the output impedance matching circuit 106 to improve the impedance matching conditions.

The fourth port is coupled to the envelope detection and feedback signal circuit 111, as shown in FIG. 1, to allow for the power monitoring or, for example linearization of the power device 100, according to the information provided by the fourth port, thereby, for example, allowing an optimum power output for the transistor 102 to be set based upon power requirements. For example, in use with a radiotelephone (not shown) the power device can be used to control a transmitting RF signal based upon the signal needs, such as distance from a base station (not shown), thereby allowing optimisation of power requirements for a radiotelephone. Equally, the power device 100 could be used in other RF transmitting systems such as a base station (not shown).

By way of illustration, for the power device 100 described above with the specified values of capacitance and inductance, FIGS. 5, 6, 7 and 8 illustrate the typical frequency response of the bilateral power monitoring circuit 107.

Figure 5:
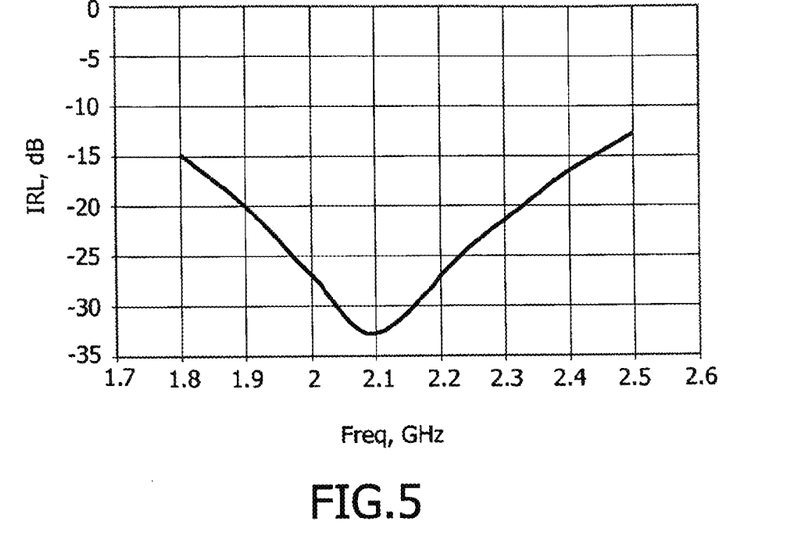
FIGS. 5, 6, 7, 8 illustrate some performance characteristics of a bilateral power sensor circuit according to an embodiment of the present invention.

FIG. 5 illustrates a typical insertion return loss (IRL, S11) at port 3 and port 4 over a frequency range. There is a focus in the return loss, showing that just around a desired frequency coupling takes place between the bond wires 106 (the outgoing signal from the first port) to the bond wire 107 (the power monitoring signal from the third port to the fourth port).

Figure 6:
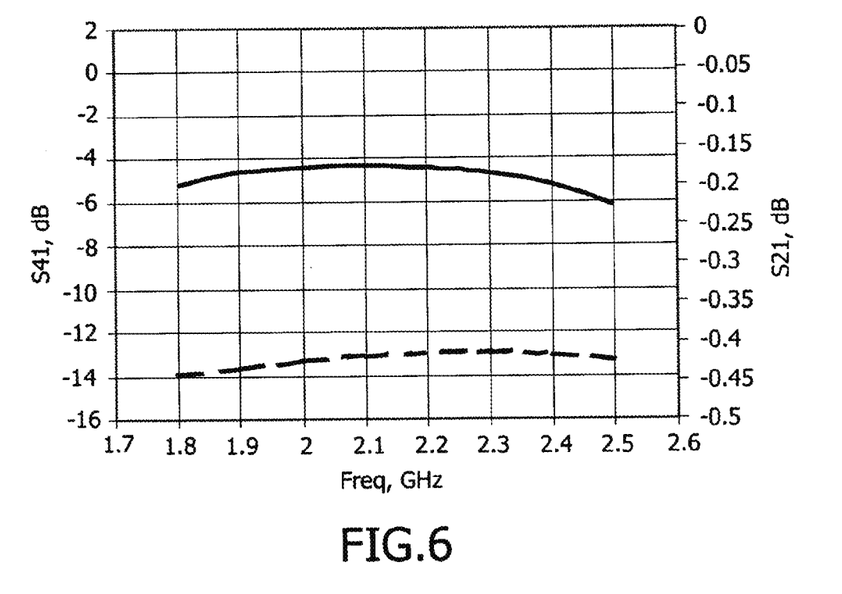

FIG. 6 illustrates the power directivity from port 1, the power transistor output, to port 2 and port 4. As can be seen, the S14 is above −13 dB. This corresponds to about 5% of the signal from port 1 to port 2, and to a power loss of 0.25 dB at the second port, which is about 6% of the power at port 1. Such a power loss is very well acceptable, usual rules relating to couplers desire to have a loss of less than 0.50 dB. It moreover shows the advantage of allowing independent control of power delivered to a load and power reflected from it, with high directivity or isolation between forward and reflected power sensors ports. This is of course an important criteria while working with an amplified signal. Another point here is that the S14 graph is very broad, which implies that it can be used in a wide frequency range and thus for broad band applications. However, generally, the band width of the coupler is larger than that of the amplifier.

Figure 7:
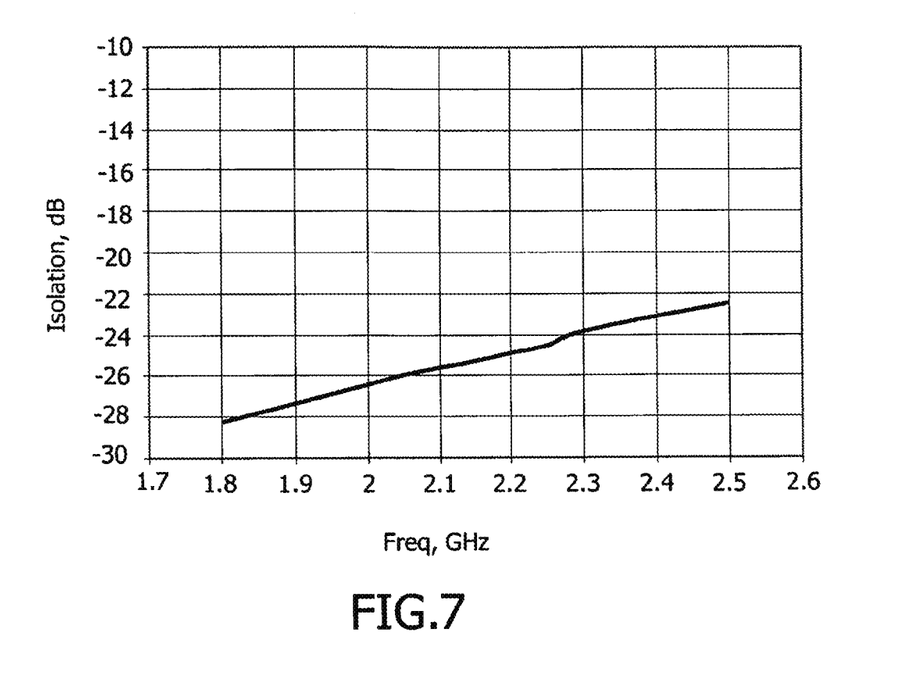

FIG. 7 illustrates typical isolation between port 3 and port 4 (S34). There is here some frequency dependence, but this is linear and not very strong (between −28 and −22 dB). As a result, the return signal can be distinguished from noise.

Figure 8:
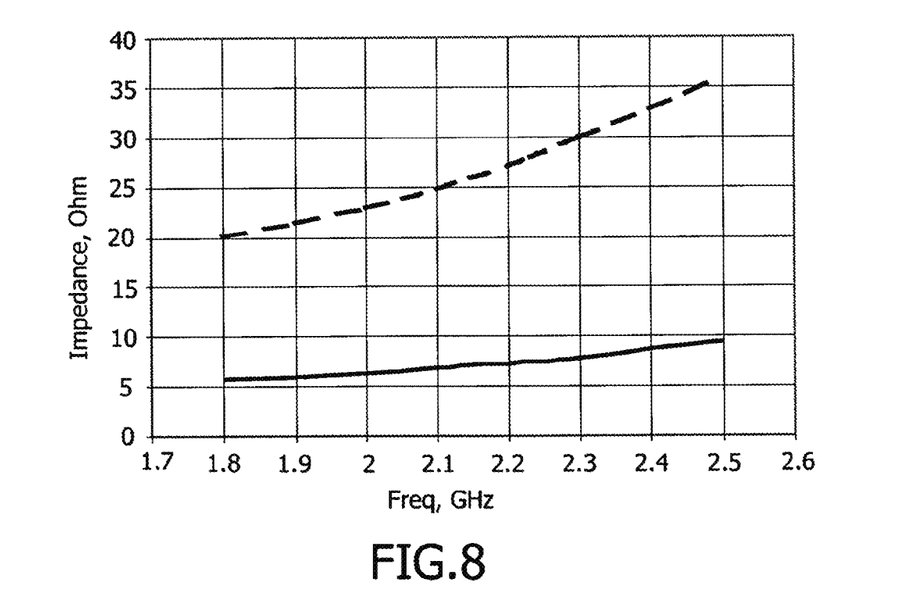

FIG. 8 illustrates the characteristic impedance of the ports verses frequency. FIGS. 5, 6, 7 and 8 show frequency in GHz on the x-axis and dB's on the y-axis.

As would be appreciated by a person skilled in the art the inductor and capacitor values provided above are by of illustration and, as such, any suitable values could be used, thereby providing different RF characteristics as required.

The invention claimed is:

1. A power device comprising:
    a transistor;
    a lumped element capacitance inductive capacitance analog of a transmission line configured to form an output matching circuit for the transistor, said analog of a transmission line having a first port and a second port, wherein the first port is coupled to an output of the transistor; and
    a directional coupler inductively coupled to said analog of a transmission line configured to form a power sensor for the transistor, wherein the power sensor comprises a third port and a fourth port;
    wherein an inductive element of said analog of a transmission line is formed by plurality of bonding wires, the power device further comprising a first capacitance between the first port and ground and a second capacitance between the second port and ground;
    wherein the directional coupler is a lumped element inductive capacitance coupler;
    wherein an inductive element of the directional coupler is a bonding wiring that is inductively coupled to said plurality of bonding wires, the power device further comprising a third capacitance between the third port and the second port, a fourth capacitance between the third port and ground, a fifth capacitance between the first port and the fourth port, and a sixth capacitance between the fourth port and ground;
    wherein the fourth port of the directional coupler is configured to provide an indication of power reflected from a load coupled to the second port.

2. The power device according to claim 1, wherein the power sensor is a directional bilateral RF power sensor.

3. The power device according to claim 1, wherein the third port of the directional coupler is configured to provide an indication of power delivered to a load via said analog of a transmission line.

4. The power device according to claim 1, wherein the fourth port is configured to provide an input to a bias control circuit for controlling the bias of the transistor.

5. The power device according to claim 1, wherein the first capacitance is a parasitic output capacitance of the transistor.

6. The power device according to claim 1, wherein said analog of a transmission line is configured to provide a phase shift of a signal at an operational frequency substantially equal to or multiples of odd numbers of 90 degrees.

7. An RF transmitting device comprising a power device according to claim 1.

8. A radiotelephone comprising a power device according to claim 1.

9. A base station comprising a power device according to claim 1.

* * * * *